United States Patent [19]

Morrison

[11] Patent Number: 4,994,937
[45] Date of Patent: Feb. 19, 1991

[54] HYDRAULIC THERMAL CLAMP FOR ELECTRONIC MODULES

[75] Inventor: Robert A. Morrison, Long Beach, Calif.

[73] Assignee: Lockheed Corporation, Calabasas, Calif.

[21] Appl. No.: 455,212

[22] Filed: Dec. 22, 1989

[51] Int. Cl.⁵ .............................................. H05K 7/20
[52] U.S. Cl. .................................... 361/386; 174/16.3
[58] Field of Search ...................... 174/16.3; 165/80.1, 165/80.3, 80.4, 165; 211/41; 357/81–82; 361/381–382, 385–389, 415

[56] References Cited

U.S. PATENT DOCUMENTS 3,993,123 11/1976 Chu et al. ........................... 361/382
4,447,842 5/1984 Berg .................................... 361/385

Primary Examiner—Gregory D. Thompson
Attorney, Agent, or Firm—Louis L. Dachs

[57] ABSTRACT

The invention is a clamp for thermally clamping a circuit board module by its edge to spaced guide rails within an enclosure, the guide rails forming a channel for the module. In detail, the system includes at least one hollow closed off tube, filled with a fluid-like material, joined to the edge of the module, the at least one tube having a semi-flexible wall and a specific width and volume. A mechanism is mounted to the module for decreasing the volume of a portion of the at least one tube causing the remaining portion of the at least one tube to increase in width clamping the module between the guide rails.

10 Claims, 3 Drawing Sheets

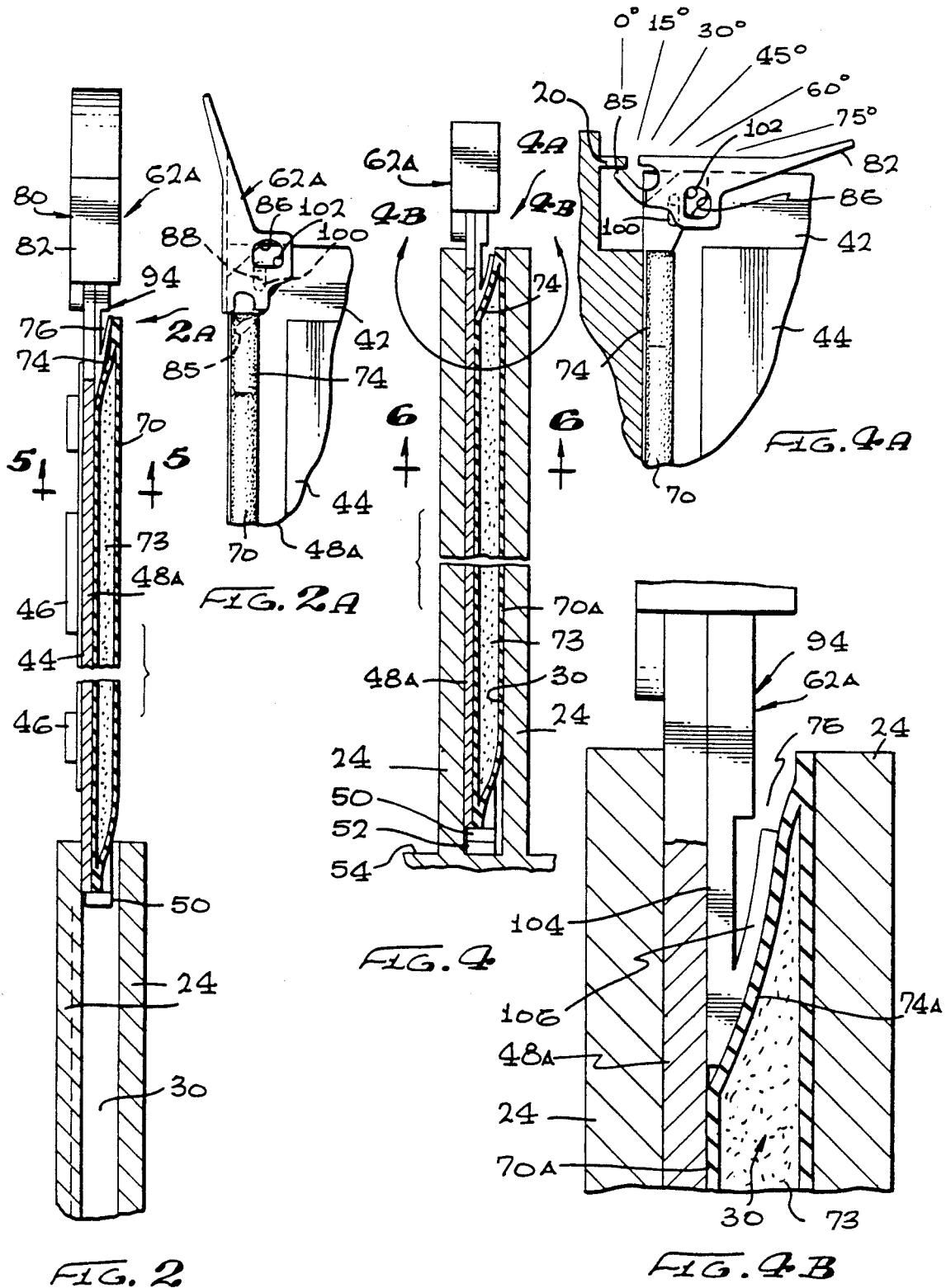

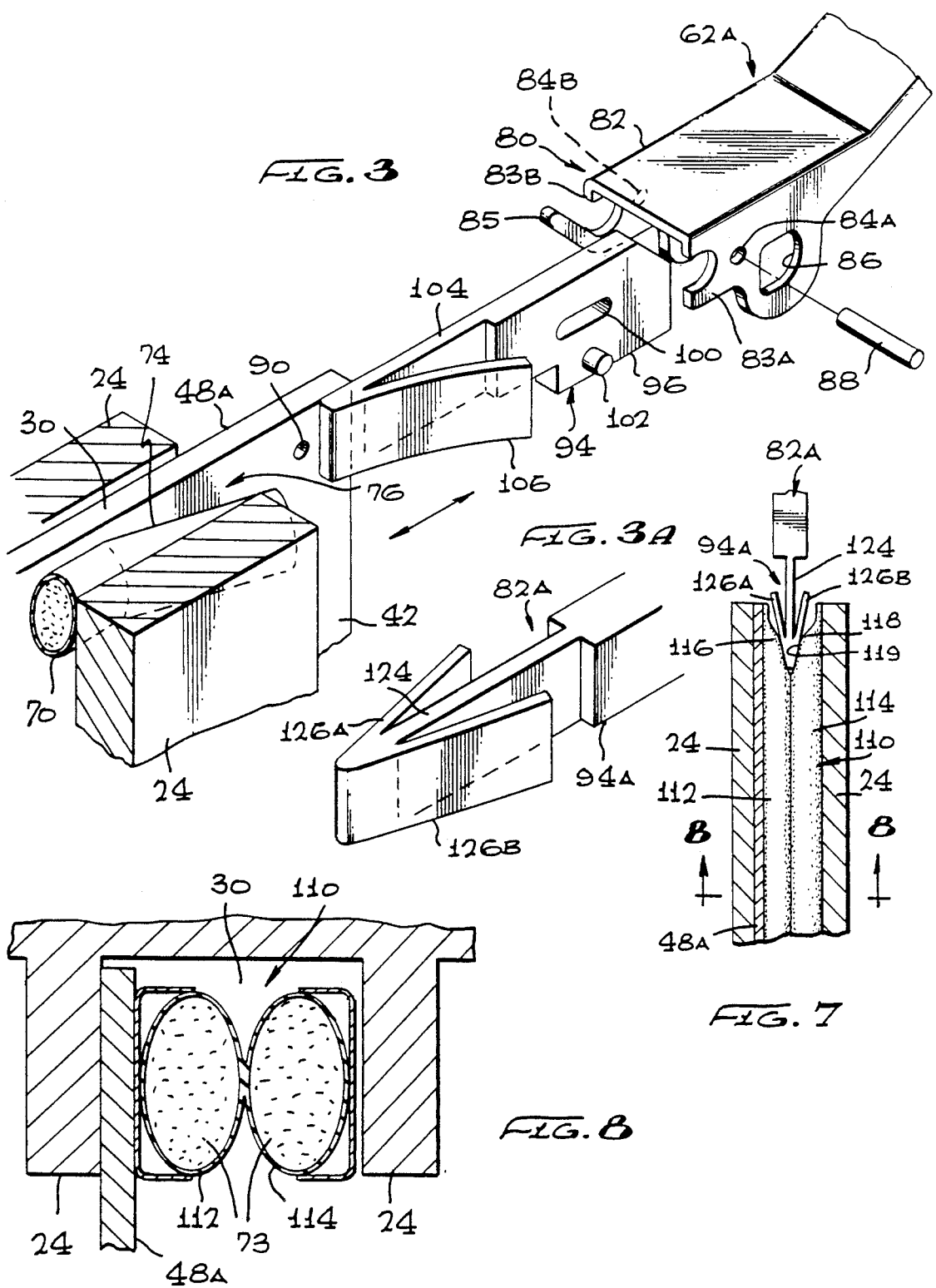

HYDRAULIC THERMAL CLAMP FOR ELECTRONIC MODULES

BACKGROUND OF THE INVENTION

1. Field of the Invention

The invention relates to the field of systems for installing heat generating circuit board modules into enclosures, and, in particular, to a system for clamping the circuit board modules to guide rails in the enclosure providing good thermal conduct therebetween.

In electrical equipment on-board aircraft, low weight and compactness are critical parameters in the design thereof. In order to more easily repair and replace individual electronic components, most of them are mounted on easily removable circuit board modules. The circuit board modules are rack mounted in enclosures and, typically, are automatically plugged into mother boards on the back wall upon insertion via mating connector halves mounted on both the motherboard and module. The weight and size limitations require that they be closely packed in the enclosures and, since a great many of these components generate heat when in operation, both air and liquid cooling systems have been used. One such method is to clamp the circuit board modules to the mounting guide rails in the enclosure and use the guide rails to transfer and distribute the heat to a solid metal guide rail support plate. Cooling fluid is pumped over the back side of the plate absorbing the heat, and thus, transferring the heat out of the enclosure. Alternately, the cooling fluid can be pumped directly through internal passages in the guide rails providing better heat transfer efficiency. However, regardless of the cooling system used, efficient heat transfer depends upon obtaining a good thermal contact (clamping) between the edge of the circuit board module and the guide rails.

Present day thermal clamps are mechanical in nature. For example, U.S. Pat. No. 4,480,287 "Module Retainer Apparatus" by K. Jensen discloses a clamp having three or more interlocking wedged shaped bodies which are slotted and keyed together to allow tightening using a single screw which can be turned from the module insertion side of the enclosure. A center body of the clamp includes a U-shaped channel with a square cross-section and sloped ends. Holes are provided for attaching to either the module or the enclosure guide rails. Each end body has a keying guide extending from a sloped end. The screw extends through a clearance hole in an end-body, then through the center body U-shaped channel and, finally, into a threaded hole in opposite end body. When the screw is tightened, the end body slides along the ends of the center body causing them to wedge the module against the enclosure guide rails. The end bodies are held in alignment with respect to the center body using keying guides which extend from the end of the bodies into slots in the base of the center body. This clamp is designed to provide both locking of the module within the enclosure as well as thermal clamping, thus, depending upon friction to maintain the circuit board module within the enclosure. Additionally, such "wedge body" type thermal clamps have numerous components which are subject to wear and jamming.

U.S. Pat. No. 4,318,157 "Apparatus for Mounting Circuit Cards" by W. J. Rank et al. discloses a somewhat similar design; however, the screw is also adapted to readily engage a hole in the back wall of the enclosure providing positive locking of the circuit board module within the enclosure as well as thermal clamping. While this design provides positive locking it is also composed of numerous parts which are subject to wear and jamming. Furthermore, rotation of a screw to provide thermal clamping as well as locking of the module within the enclosure is a time consuming operation. In U.S. Pat. No. 4,414,605 "Positive Locking Mechanism" by J. J. Chino et al. a screw is used to secure the circuit board module in the enclosure while a spring biased over center latch arrangement is used to operate a three-part wedge body assembly to achieve thermal clamping. While the use of the over center lever or latch provides rapid thermal clamping, however, the mechanism is complicated and the use of a separate screw to lock the module within the enclosure increases installation time and requires the use of a tool.

U.S. Pat. No. 4,751,963 "Thermal Conductance Retainer for Electronic Printed Circuit Boards and the Like" by T. T. Bui et al. discloses a more complicated version of the wedge body clamp concept. Here a single wedge body assembly is mounted in the enclosure and moves in a direction parallel to the circuit board module; however, the opposite surface of the wedge body is tapered and rides in a groove tapered parallel to the guide rail. When the screw is tightened, the wedge body is forced into the tapered groove and, thus against the edge of the circuit board module. Thus, this design only allows for the mounting of the clamp to the enclosure. Thus, if the clamp became inoperative it would have to be removed from the enclosure or the whole electronic enclosure would have to be removed from the vehicle. This is a major draw back when compared to thermal clamps which are mountable to the circuit board module. U.S. Pat. No. 4,298,904 "Electronic Conduction Cooling Clamp" by P. C. Koenig discloses another variation on the wedge body type clamp. Here compound angles on the wedges translate an axial force into two forces at right angles thereto and result in the wedge bodies contacting multiple heat transfer surfaces. Again, as with all the wedge body type clamps, they are subject to wear and jamming.

In U.S. Pat. No. 4,157,583 "Circuit Board Clamping Assembly" by F. J. Basmajian et al. a clamp is disclosed wherein a shaft is rotatably mounted along the edge of the circuit board module and incorporates a cam at its center. Rotation of the cam causes the cam to contact a guide rail forcing the edge of the circuit board module in contact with the opposite guide rail. While this device is simple in nature, it does not provide for a continuous clamping force to be applied along the edge of the circuit board module and also depends upon frictional forces to lock the module within the enclosure or the use of a separate locking system. U.S. Pat. No. 3,992,653 "Zero insertion Force Card Guide" by P. H. Richardson et al. and U.S. Pat. No. 4,550,836 "Clamp Arrangements" by S. M. Ellis both disclose lever actuated spring lock devices, which upon locking, force springs under compression load into engagement with the edges of the circuit board modules. However, the use of the springs do not provide a positive positional lock and, under certain circumstances, high vibration loads could allow the circuit board modules to vibrate. Finally, U.S. Pat. No. 4,779,674 "Sawtooth Card Retainer" by C. T. McNulty discloses a circuit board module thermal clamp which comprises a mated pair of sawtooth bars which slidably engagable teeth. The bars are laterally spread apart and held by a screw or spring, in order to push against and hold the edge to a guide rail. Here the drawback is that the device is subject to jamming by foreign debris which may lodge in the sawtooth teeth.

Thus, it is a primary object of the subject invention to provide a thermal clamp for electronic circuit modules mounted within electronic enclosures.

It is another object of the subject invention to provide a thermal clamp for electronic circuit board modules mounted within an electronic enclosure combined with a mechanism for locking the module within the enclosure.

It is another object of the subject invention to provide a thermal clamp for electronic circuit board modules mounted within an electronic enclosure combined with a mechanism for locking the module within the enclosure which does not require tools.

It is a further object of the subject invention to provide a thermal clamp for circuit board modules mounted within electronic enclosures utilizing a minimum number of parts.

It is a still further object of the subject invention to provide a thermal clamp for electronic circuit board modules mounted within electronic enclosure utilizing hydraulic pressure to provide the thermal clamping force.

SUMMARY OF THE INVENTION

A typical printed circuit board modules include many heat generating components and since the modules are generally closely packed into an enclosure, a significant amount of heat is generated which must be transferred out of the enclosure. Thus, the circuit board is typically mounted to a metal plate which is in thermal contact with the heat generating components. The heat is conducted through the plate into mounting guide rails in the enclosure and, thereafter, to internal passages within the enclosure. Coolant is used to conduct the heat to a heat exchanger. Therefore, to obtain high heat transfer efficiency, good thermal conduct between the edge of the plate and the guide rails is a necessity.

Thus, the invention is a thermal clamp for clamping the peripheral edges of a printed circuit board module to guide rails within an electronic enclosure to ensure an efficient heat transfer from the plate to the guide rail. In detail, the clamp comprises a hollow closed off tube filled with a fluid like material joined to the edge of the module, preferably by soldering or braising. The tube preferably has a semi-flexible wall (can hold its shape but it is easily deformed) with a ellipsoidal cross-section and a specific width. A suitable material is Be-Cu alloys. The total width of the tube plus the width of the edge of the plate must allow for the insertion of the module into the channels formed by the guide rails. The fluid is preferably Ethylene-Glycol, but a mixture of Preston and water can be used. Alternately, other materials such as a paste or jelly can be used. The main requirement for all intensive purposes of the invention is that the fluid must be incompressible.

Means for decreasing the volume of a portion of the tube are mounted to the module which upon actuation causes the remaining portion of the tube to change from its ellipsoidal cross-section to a generally circular shape increasing its specific width. The new width plus the thickness of the edge will now be significantly greater than the channel causing the plate to be clamped to the guide rail creating a good thermal contact therebetween. Also, the contact by the tube with the opposite guide rail further improves heat transfer rates.

A preferred means requires that the end portion does not be joined to the edge of the plate but taper away therefrom forming a tapered slot. A wedge member is slidably mounted to the plate which includes a body portion having a wedge portion attached thereto with a shape complementary to the slot. The tapered side of the wedge portion is in the form of a leaf spring. The wedge member is movable from a first position wherein the wedge portion is near or in contact with the slot to a second position wherein the end portion of the tube is compressed, decreasing the volume of the end portion causing the remaining portion to change shape to the desired circular shape. The means further includes a lever, typically, rotatably mounted to the module, having a cam slot and, additionally, a hook member for engaging a notch on the enclosure. A pin is mounted to the body portion of the wedge member extends into this cam slot. Thus, after installing a module in the channel such that the connector half on the module contacts the connector half on the back wall of the enclosure, initial rotation of the lever will cause the hook to engage the notch and drive the connector halves together. At this point the module will be properly installed in the enclosure. Further rotation of the lever a full 90° degrees will cause the cam slot to engage the pin driving the wedge member into its second position into the end portion of the tube. Upon full rotation of the lever, it becomes in an overt center-type locking position and the module is both secured in the enclosure and thermally clamped.

In instances where the channel is so large that a single tube cannot be expanded sufficiently to clamp the module in place, a multiple number of tubes can be used, typically no more than two tubes. Here a second tube is joined to the first tube; however, the end portions are tapered away from each other forming a V-shaped slot at one end. The wedge member is modified so that the wedge portion has a complimentary V-shape with both legs of the V in the form of leaf springs. Thus, when the lever is now actuated the end portions of both tubes will be compressed.

Thus, it can be seen that the hydraulic clamp not only provides thermal clamping, but also serves to lock the module within the enclosure. However, it must be understood that the two functions need not be combined.

The novel features which are believed to be characteristic of the invention, both as to its organization and method of operation, together with further objects and advantages thereof, will be better understood from the following description in connection with the accompanying drawings in which the presently preferred embodiments of the invention are illustrated by way of example. It is to be expressly understood, however, that the drawings are for purposes of illustration and description only and are not intended as a definition of the limits of the invention.

BRIEF DESCRIPTION OF THE DRAWINGS

Illustrated in FIG. 1 is a perspective view of an enclosure for receiving circuit board modules incorporating the hydraulic thermal clamp.

Illustrated in FIG. 2 is a partial exploded cross-sectional view of FIG. 1 taken along the line 2—2, particularly showing the hydraulic thermal clamp in the unclamped position.

Illustrated in FIG. 2A is a partial side view of FIG. 2 taken in the direction of arrow 2A.

Illustrated in FIG. 3 is a partial perspective view of the hydraulic thermal clamp.

Illustrated in FIG. 3A is a partial perspective view of a modified version of the wedge member used in the hydraulic thermal clamp.

Figure 1:
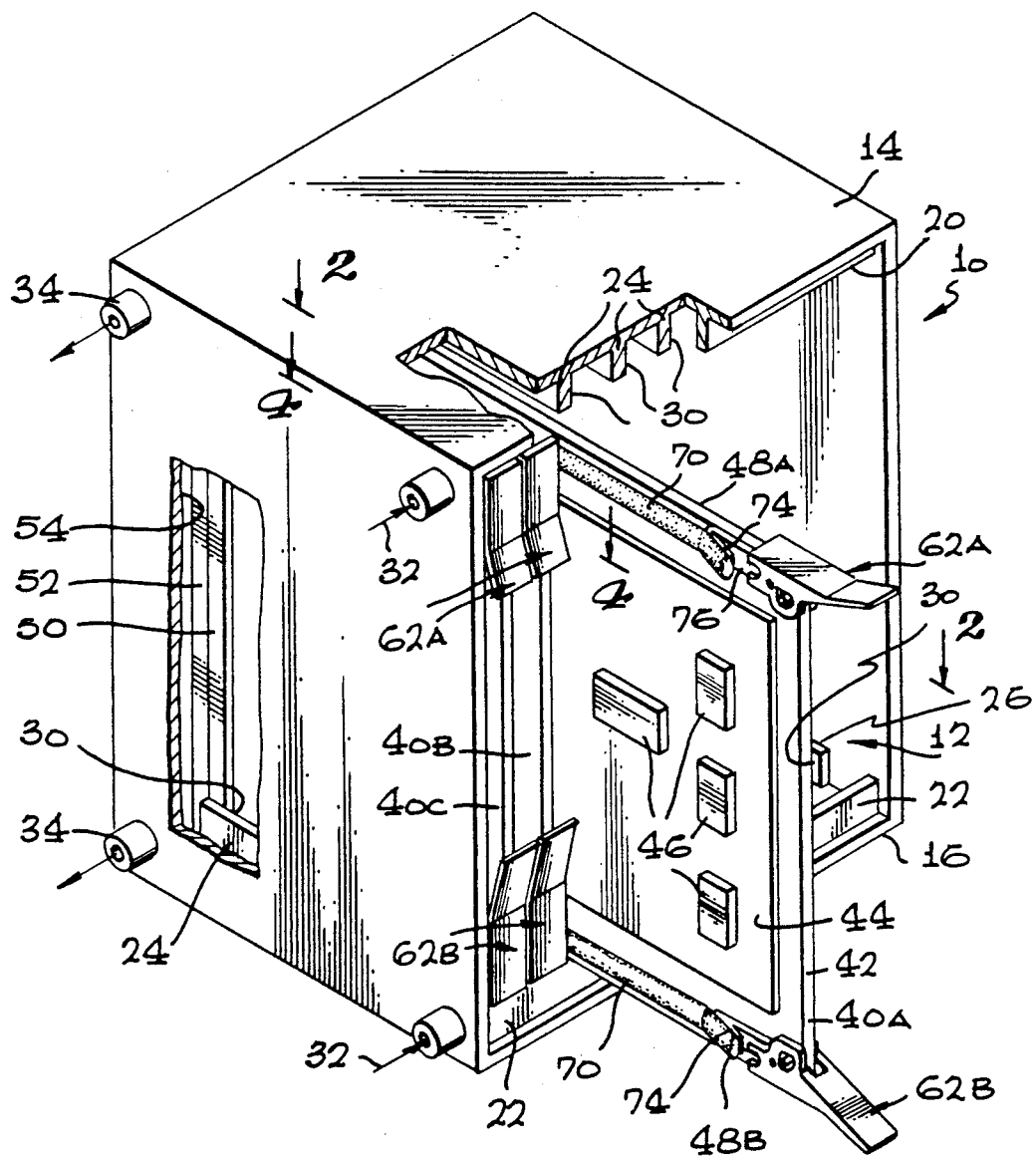

Illustrated in FIG. 4 is a partial cross-sectional view of FIG. 1 taken along the line 4—4, particularly showing the hydraulic thermal clamp in the clamped position.

Illustrated in FIG. 4A is a partial side view of the hydraulic thermal clamp shown in FIG. 4 taken along the direction of arrow 4A.

Illustrated in FIG. 4B is an enlarged view of a portion of FIG. 4 encompassed by the arrow 4B.

Figure 5:
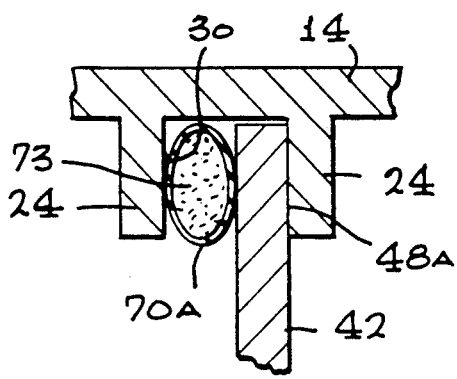

Illustrated in FIG. 5 is a cross-sectional view of FIG. 2 taken along the line 5—5.

Figure 6:
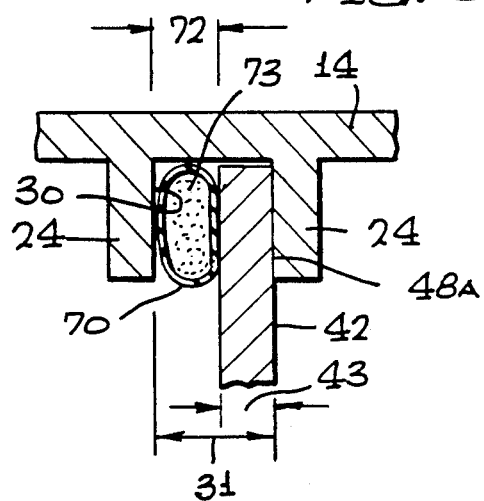

Illustrated in FIG. 6 is a cross-sectional view of FIG. 4 taken along the line 6—6.

Illustrated in FIG. 7 is a cross-sectional view similar to FIG. 2, particularly illustrating an alternate design of the hydraulic thermal clamp.

Illustrated in FIG. 8 is a cross-sectional view of FIG. 7 taken along the line 8—8.

DESCRIPTION OF THE PREFERRED EMBODIMENT

Referring to FIG. 1, 2, 2A, 4, 4A, 4B, 5 and 6 are examples of existing state of the art electronic enclosures and, are illustrated and generally indicated by numeral 10, having an open end 12. The upper and lower walls 14 and 16 of the enclosure 10 incorporate continuous internal latch hooks 20 and 22, respectively, extending across the open end 12. Internally spaced from the open end 12 are a plurality of upper and lower aligned guide rails 24 and 26, respectively, forming aligned channels 30, each having a width 31 (best seen in FIG. 6). Inlet and outlet coolant flow ports 32 and 34, respectively, are illustrated; however, internal coolant passages and an external coolant supply system are not illustrated, since they are not essential parts of the invention. However, an example of such a coolant system can be found in Assignee's co-pending U.S. Patent Application Ser. No. 422,181, Cooling System of Electronic Circuit Board Modules by Robert A. Morrison, filed Oct. 16, 1989 and herein incorporated by reference. Also illustrated is a first circuit board module 40A shown partially installed and second and third circuit board modules 40B and 40C shown completely installed and locked in place. The circuit board module 40A, as well as all the others, comprises a heat conducting metal plate 42, having a thickness indicated by numeral 43 (best seen in FIG. 6). Mounted to the plate 42 is a circuit board 44 having numerous heat generating electrical components 46 mounted thereon. It is the heat generated from these components which must be transferred from the circuit board 44 to the plate 42, through the guide rails 24 and out of the enclosure 10. It can be seen that module 40C incorporates an electrical connector half 50 which mates with connector half 52 mounted to a back wall 54 of the enclosure 10. All of the circuit board modules are identical and, thus, subsequent remarks will be limited to circuit board module 40A.

It can be seen in these Figures that mounted to the edges 48A and 48B of the plate 42 are thermal clamps 62A and 62B, respectively, which are the main thrust of the invention. Because all the thermal clamps are identical, subsequent remarks will be directed toward clamp 62A. The clamp 62A includes a closed-off, hollow tube 70, generally ellipsoidal in shape, having a specific width, indicated by numeral 72, (best seen in FIG. 6) and which for purposes of illustrated has been exaggerated to show the ellipsoidal shape). The tube 70 is preferably made of a metal such as a Be-Cu alloy and is thus semiflexible, i.e., can maintain its shape but is easily deformed. The tube 70 is filled with a fluid-like material, preferably a liquid 73, such as ethylene glycol or alternately a combination of 60% Prestone and 40% distilled water. However, it should be understood that a fluid in the form of a readily deformable paste or jelly could also be used. The tube 70 is joined to the edge 48A of the plate 42 by soldering or braising along substantially all its length. However, end portion 74 of the tube 70 tapers away from the edge 48A forming a tapered slot 76.

Still referring to the previously mentioned Figures, but particularly referring to FIG. 3, it can be seen that the hydraulic thermal clamp 62A includes a lever assembly 80 which is pivotally attached to plate 42 along edge 48A. The lever assembly 80 includes a U-shaped lever 82 having sides 83A and 83B, respectively, with aligned holes 84A and 84B, respectively. Also attached to the lever assembly 80 is a protrusion 85 attached to side 83B. The lever 82 also includes a cam slot 86 on side 83A. The lever 82 is pivotally attached to the plate 42 by means of a pin 88 which fits through the aligned holes 84A and 84B and a hole 90 in the edge 48A of plate 42. The lever 82 is pivotable from a first portion extending outward and generally parallel to the edge 48A of the plate 42 some ninety degrees to a second position. A wedge portion member 94 is slidably mounted to the plate 42 which includes a flat-bodied portion 96 having an elongated slot 100 and a protruding pin 102. A wedge 104 extends forward from the body portion 96 and is in a shape complementary to the slot 76 and includes a leaf spring portion 106.

The lever assembly 80 is assembled by installing the wedge member 94 into the lever 82 such that the slot 100 is aligned with the holes 84A and 84B, and pin 102 protrudes into the cam slot 86. The assembled wedge member 94 and lever 82 are positioned such that holes 84A and 84B are aligned with the hole 90 in the plate 42 and the pin 88 is installed through hole 84A, slot 100, hole 90, and hole 84B. The location of the hole 90 and the sizing of the wedge member 94 are such that the wedge 104 extends into slot 76 and is in close proximity to or just in contact with the tapered end portion 74 of the tube 70.

The circuit board module 40A is installed with the lever 82 extended as shown in FIGS. 2 and 2A by pushing, the circuit board module is pushed into the channel 30 until connector half 50 abuts connector half 52 mounted on the back wall 54 of the enclosure. Note that since the tube 70 is semiflexible, the combined width 43 of the plate 42 plus the width 72 of the tube 70 is limited only to the extent necessary to allow insertion of the module 40A into the channel 30 (best seen in FIG. 6). However, a slight gap is preferred to prevent rubbing. The lever 82 is then rotated downward from the horizontal. The first 60 degrees of lever rotation moving the lever from the first position to an intermediate position (a rotation of approximately 60° degrees) causes the protrusion 85 to engage the hook 20, forcing the module 40A further into the enclosure 10 so that the connector halves 50 and 52 come into electrical contact. At this point, the pin 102 on the wedge member 94 contacts the cam slot 86 while pin 88 continues to ride in slot 100. At the 60 degree angle, the cam slot 86 contacts the pin 102 and the last 30 degrees of rotation of the handle 82 to its second position forces the wedge member 94 forward so that the wedge 104 engages end portion 74 of the tube 70 causing it to compress, indicated by numeral 74A, and to, thus, generally decrease the internal volume of the end portion 74 of the tube 70 (best seen in FIGS. 4 and 4B).

Since the ellipsoidal shaped tube 70 has semiflexible walls, it tends to become round as indicated by numeral 70A in FIG. 5, increasing sufficiently in width so as to plate 42 into engagement with the guide rail next to plate 42 making good thermal contact, i.e., the width 72 of the tube 70 plus the thickness 43 of the plate 40 now is greater than the width 31 of the slot 30. The use of the leaf spring portion 106 allows the wedge member 94 to absorb any tolerance buildup in the components making up the clamp 62A.

Often, the size of the channel 30 may be so large as to prevent a single tube 70 from expanding sufficiently to make physical contact with the guide rails of a channel. In such instances, a multiple tube clamp can be used. This is illustrated in FIGS. 7, 8, and 3A which illustrates such an alternate design. Particularly, referring to FIG. 7 and 8, it can be seen that the channel 30 is larger than can be accommodated by a single tube 70 and, thus, a multiple tube assembly, generally indicated by numeral 110, is used. It is composed of two braisedtogether tubes 112 and 114, respectively, with the tube 112 braised to the plate 42. Note that end portions 116 and 118 of the tubes 112 and 114, respectively, are now tapered away from each other forming a V-shaped slot 119.

Still referring to FIGS. 7 and 8, and now also to FIG. 3A, it can be seen that the lever assembly 82A incorporates a wedge member 94A, having a wedge 124 with leaf spring legs 126A and 126B, which is complementary to the V-shaped slot 119. Operation is identical to previous example.

While the invention has been described wherein the lever assembly 80 provides both thermal clamping of the circuit board module 40A to the guide rail 24 and the locking of the module 40 into the enclosure 10, it is not necessary that the two functions be so combined. It will be well understood by those skilled in the art to which this invention pertains that the two functions could be made separate.

While the invention has been described with reference to particular embodiments, it should be understood that the embodiments are merely illustrative as there are numerous variations and modifications which may be made by those skilled in the art. Thus, the invention is to be construed as being limited only by the spirit and scope of the appended claims.

INDUSTRIAL APPLICABILITY

The invention has applicability to the electronics industry and, in particular, where heat generating circuit boards are used.

I claim:

1. A system for clasping a circuit board module by an edge to spaced guide rails within an enclosure, the guide rails forming a channel for a module, the system comprising:
   a circuit board module having an edge;
   at least one hollow closed-off tube filled with a fluidlike material joined to said edge of said module, said at least one tube having a semi-flexible wall and a specific width and volume; and
   means mounted to said module for decreasing the volume of a first portion of said at least one tube causing the remaining second portion of said at least one tube to increase in width.

2. The system as set forth in claim 1, wherein:
   said at least one tube is generally ellipsoidal in cross-sectional shape; and
   said means for decreasing said volume of (a) said first portion of said at least one tube causes said at least one tube to change to a generally circular shape.

3. The system as set forth in claim 2, wherein the combined said specific width of said at least one tube and the width of said edge of said module are such that said module can be inserted within the channel.

4. The system as set forth in claim 3, wherein said means comprises:
   a wedge means slidably mounted to said module, movable from a first position in proximity to said first portion of said at least one tube to a second position in engagement with said first portion reducing the volume thereof; and
   lever means mounted to said module for moving said wedge means from said first position to said second position.

5. The system as set forth in claim 4, wherein:
   there is one tube and said first portion of said one tube is a tapered end of said tube which tapers away from the edge of said module forming a tapered slot; and
   said wedge means includes a wedge portion having a shape complimentary to said slot.

6. The system as set forth in claim 5, wherein the tapered side of said wedge portion is a leaf spring.

7. The system as set forth in claim 4, wherein:
   there are two tubes, one of said tubes joined to said edge of said module, said two tubes joined together along a common side and having end portions tapering away from each other forming a V-shaped slot; and
   said wedge means having a V-shaped wedge portion complimentary to said V-shaped slot.

8. The system as set forth in claim 7, wherein said V-shaped wedged portion is composed of a pair of leaf springs.

9. The system as set forth in claims 5 or 8, wherein:
   said wedge means includes a cam follower; and
   lever means comprises a lever pivotally mounted to said module movable from a first position to a second position and an intermediate position therebetween, said lever having a cam surface engagable with said cam follower and an intermediate position between such that as said lever moves from said intermediate position to said second position, said wedge means is moved from said first position to said second position.

10. The system as set forth in claim 9, wherein the enclosure includes a hook means and said lever includes a protrusion, said protrusion engagable with said hook means as said lever moves from said first position to said intermediate position locking said module to the enclosure.

* * * * *